(12) United States Patent
Sugiura

(10) Patent No.: US 10,923,992 B2
(45) Date of Patent: Feb. 16, 2021

(54) DRIVE DEVICE AND ELECTRIC POWER STEERING DEVICE USING SAME

(71) Applicant: DENSO CORPORATION, Kariya (JP)

(72) Inventor: Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 8 days.

(21) Appl. No.: 16/516,711

(22) Filed: Jul. 19, 2019

(65) Prior Publication Data

US 2020/0036269 A1 Jan. 30, 2020

(30) Foreign Application Priority Data

Jul. 25, 2018 (JP) .............................. JP2018-139309

(51) Int. Cl.
| | |
|---|---|
| *H02K 1/32* | (2006.01) |
| *H02K 11/40* | (2016.01) |
| *H02K 5/22* | (2006.01) |
| *H02K 9/22* | (2006.01) |
| *H02K 11/33* | (2016.01) |
| *H05K 1/18* | (2006.01) |
| *H05K 7/20* | (2006.01) |
| *H05K 1/02* | (2006.01) |

(Continued)

(52) U.S. Cl.
CPC .............. *H02K 11/40* (2016.01); *B62D 5/046* (2013.01); *H02K 3/28* (2013.01); *H02K 5/225* (2013.01); *H02K 9/22* (2013.01); *H02K 11/33* (2016.01); *H05K 1/0203* (2013.01); *H05K 1/181* (2013.01); *H05K 7/209* (2013.01); *H05K 7/20854* (2013.01); *H02K 2211/03* (2013.01); *H05K 2201/066* (2013.01); *H05K 2201/10015* (2013.01); *H05K 2201/10166* (2013.01); *H05K 2201/10522* (2013.01)

(58) Field of Classification Search
CPC .... H02K 11/33; H02K 5/225; H02K 2211/03; H02K 11/215; H02K 3/28; H02K 2203/03; H02K 11/02; H02K 11/30; H02K 3/50; H02K 11/40
USPC .......... 310/64, 68 R, 68 D, 71, 179, 180, 184
See application file for complete search history.

(56) References Cited

U.S. PATENT DOCUMENTS

| | | | |
|---|---|---|---|
| 10,479,398 B2* | 11/2019 | Urimoto | B62D 5/0481 |
| 2013/0221895 A1* | 8/2013 | Kanda | H02P 27/08 318/767 |

(Continued)

FOREIGN PATENT DOCUMENTS

| | | |
|---|---|---|
| JP | 2010-40787 A | 2/2010 |
| JP | 2016-036245 A | 3/2016 |

(Continued)

*Primary Examiner* — Thanh Lam
(74) *Attorney, Agent, or Firm* — Maschoff Brennan

(57) ABSTRACT

A drive device for use in a vehicle includes a motor, a substrate, and at least one inter-system ground connection capacitor. The motor includes a plurality of motor windings within one housing. Multiple inverters are mounted on the substrate. Each inverter is connected to a different battery and a different ground to form a system, where each of the motor windings is associated with its own system. The inter-system ground connection capacitor is mounted on the substrate, and electrically connects the grounds of the systems together to reduce electrical noise propagated outside the drive device to other parts in the vehicle.

11 Claims, 13 Drawing Sheets

(51) Int. Cl.
*B62D 5/04* (2006.01)
*H02K 3/28* (2006.01)

(56) References Cited

U.S. PATENT DOCUMENTS

| 2014/0055887 | A1* | 2/2014 | Uryu .................... B62D 5/0484 |
| | | | 361/18 |
| 2014/0202781 | A1* | 7/2014 | Soma ..................... H02K 5/225 |
| | | | 180/65.1 |
| 2015/0188479 | A1* | 7/2015 | Asai ....................... H02P 25/22 |
| | | | 318/400.13 |
| 2015/0357892 | A1* | 12/2015 | Nakano .................. H02K 1/278 |
| | | | 180/443 |
| 2016/0036288 | A1 | 2/2016 | Yamasaki et al. |
| 2017/0217481 | A1 | 8/2017 | Asao et al. |

FOREIGN PATENT DOCUMENTS

| JP | 2017-191093 A | 10/2017 |
| JP | 6223593 B2 | 11/2017 |

* cited by examiner

DRIVE DEVICE AND ELECTRIC POWER STEERING DEVICE USING SAME

CROSS REFERENCE TO RELATED APPLICATION

The present application is based on and claims the benefit of priority of Japanese Patent Application No. 2018-139309, filed on Jul. 25, 2018, the disclosure of which is incorporated herein by reference.

TECHNICAL FIELD

The present disclosure relates to a drive device and an electric power steering device using the drive device.

BACKGROUND

A drive device may include a motor and an electronic control unit (ECU) packaged together in one housing. Drive devices may generate electrical noise. As such, drive devices are subject to improvement.

SUMMARY

The present disclosure describes embodiments of a drive device configured to limit and/or prevent the propagation of electrical noise outside the drive device, and describes an electric power steering device using such a drive device.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
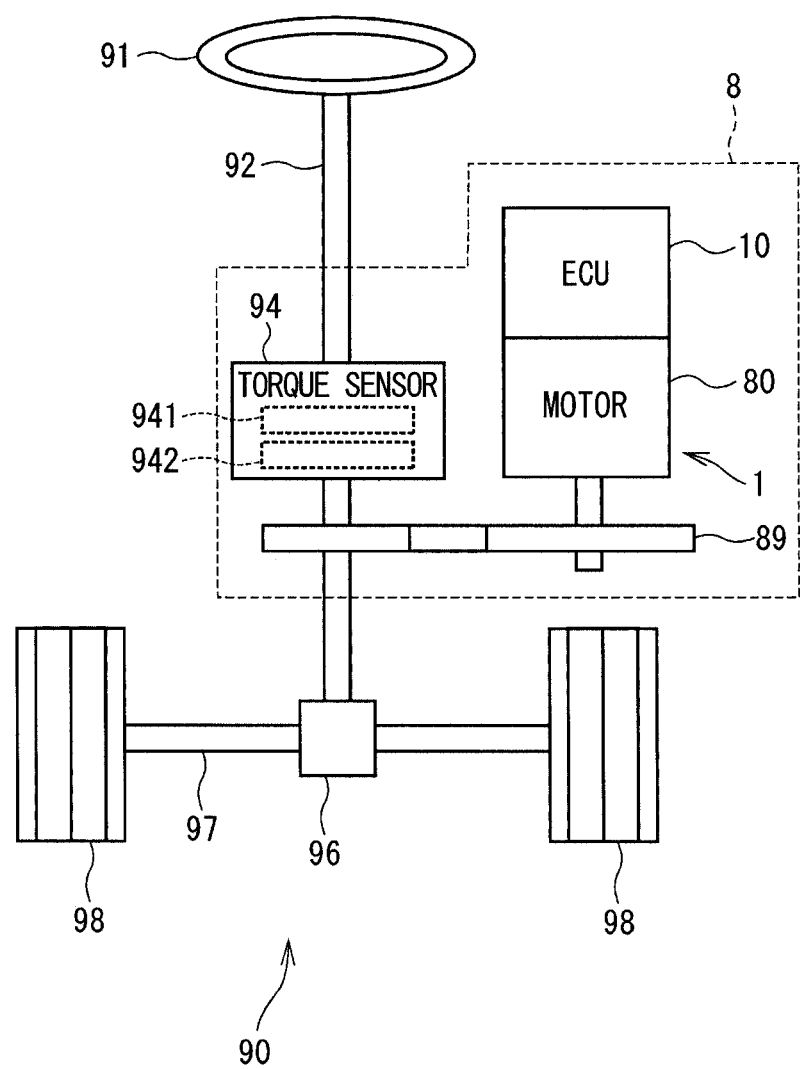
FIG. 1 illustrates a steering system schematic in a first embodiment of the present disclosure.

Conventionally, drive devices may be an integral combination of a motor and an electronic control unit (ECU) packaged together in one housing. Normal mode electrical noise generated in the course of operating the drive device may be returned to a battery side by connecting a motor case and a frame member of the drive device housing to the power supply ground line.

In drive devices having redundant configurations, where such drive devices may include two systems for driving the motor, a single ground may be shared by the two systems. In instances where grounds for each system are isolated from one another, the systems may still exchange electrical noise and propagate such electrical noise outside of the drive device to other parts of the vehicle.

The present disclosure describes embodiments of a drive device configured to limit and/or prevent the propagation of electrical noise outside the drive device and further describes an electrical power steering device using such a drive device.

Various embodiments of a drive device and an electric power steering device using the drive device are described with reference to the drawings. In the following embodiments, like features and elements among the embodiments may be referred to by the same reference numerals, and a repeat description of previously described like features and elements may be omitted from the descriptions of the latter embodiments.

With reference to FIG. 1, a drive device 1 in the first embodiment includes a motor 80 and an electronic control unit (ECU) 10. Such a drive device 1 may be used in an electric power steering device 8 to assist with a steering operation of a vehicle. FIG. 1 shows an overall configuration of a steering system 90 that includes the electric power steering device 8. The steering system 90 also includes a steering wheel 91, a steering shaft 92, a pinion gear 96, a rack shaft 97, and wheels 98 in addition to the electric power steering device 8.

The steering wheel 91 is connected to the steering shaft 92. The steering shaft 92 includes a torque sensor 94 for detecting a steering torque. The torque sensor 94 includes two torque detectors 941 and 942 where one of the two torque detectors is provided for each system, that is, for each set of winding wires in the motor 80. The detection values from the torque detectors 941 and 942 are respectively output to controllers (e.g., microcomputers or microcontrollers) 170 and 270. The pinion gear 96 is disposed at one end of the steering shaft 92. The pinion gear 96 engages the rack shaft 97. Wheels 98 are connected to both ends of the rack shaft 97 via tie rods or a like mechanical linkage.

When a driver rotates the steering wheel 91, the steering shaft 92 connected to the steering wheel 91 is rotated. The rotational movement of the steering shaft 92 is converted by the pinion gear 96 into linear movement to move the rack shaft 97 in a linear manner. The pair of wheels 98 is steered at an angle corresponding to the displacement amount of the rack shaft 97.

The electric power steering device 8 includes a drive device 40 having the motor 80, the ECU 10, and a speed reduction gear 89. The speed reduction gear 89 is a power transmission unit that decelerates the rotation of the motor 80 and transmits the rotation to the steering shaft 92. In the present embodiment, the electric power steering device 8 may be, for example, a "column assist type" electric power steering device but may also be a "rack assist type" electric power steering device that transmits the rotation of the motor 80 to the rack shaft 97.

Figure 2:
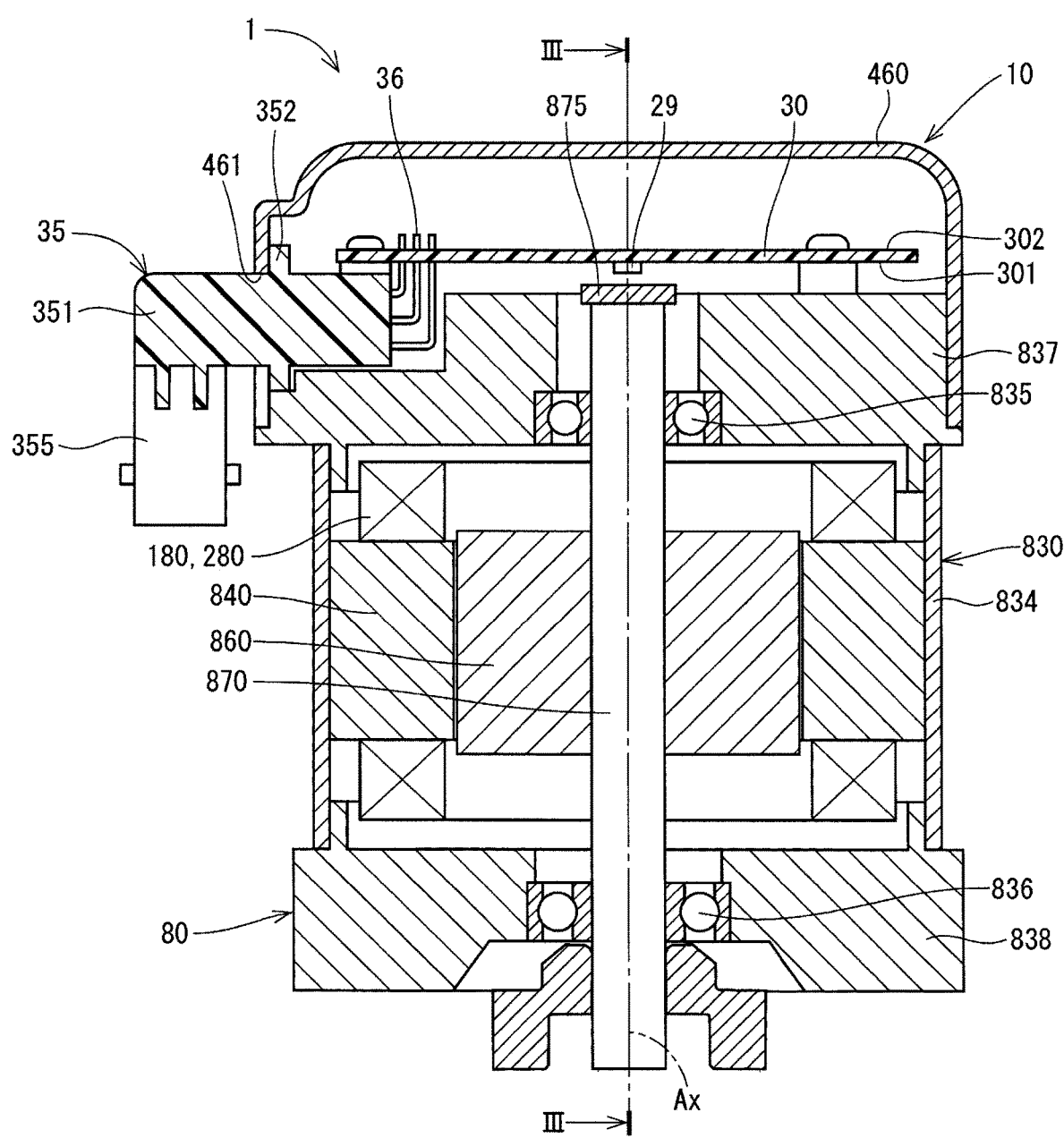
FIG. 2 illustrates a cross-sectional view of a drive device in the first embodiment.
Figure 3:
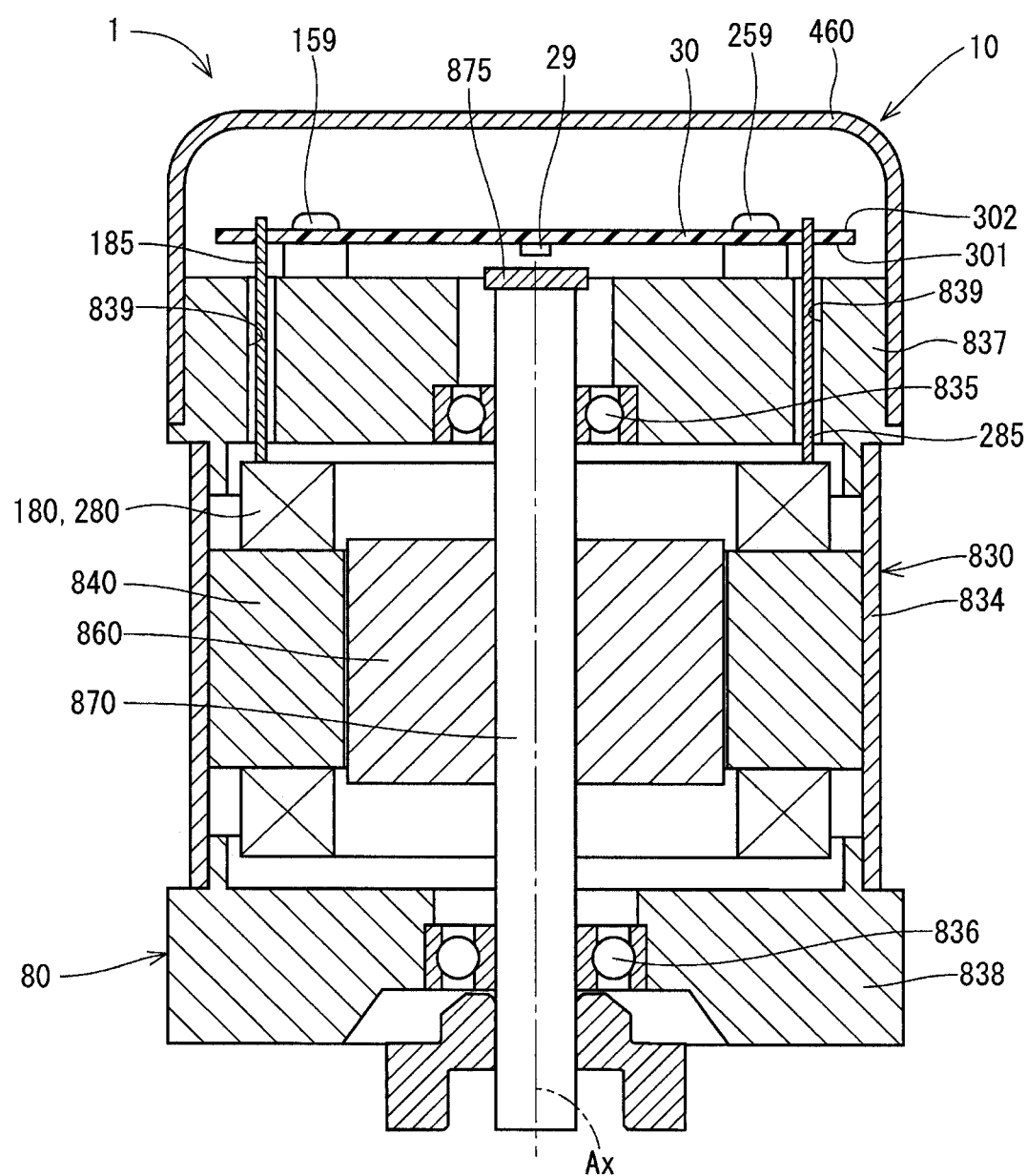
FIG. 3 illustrates a cross-sectional view taken along a III-III line in FIG. 2.
Figure 4:
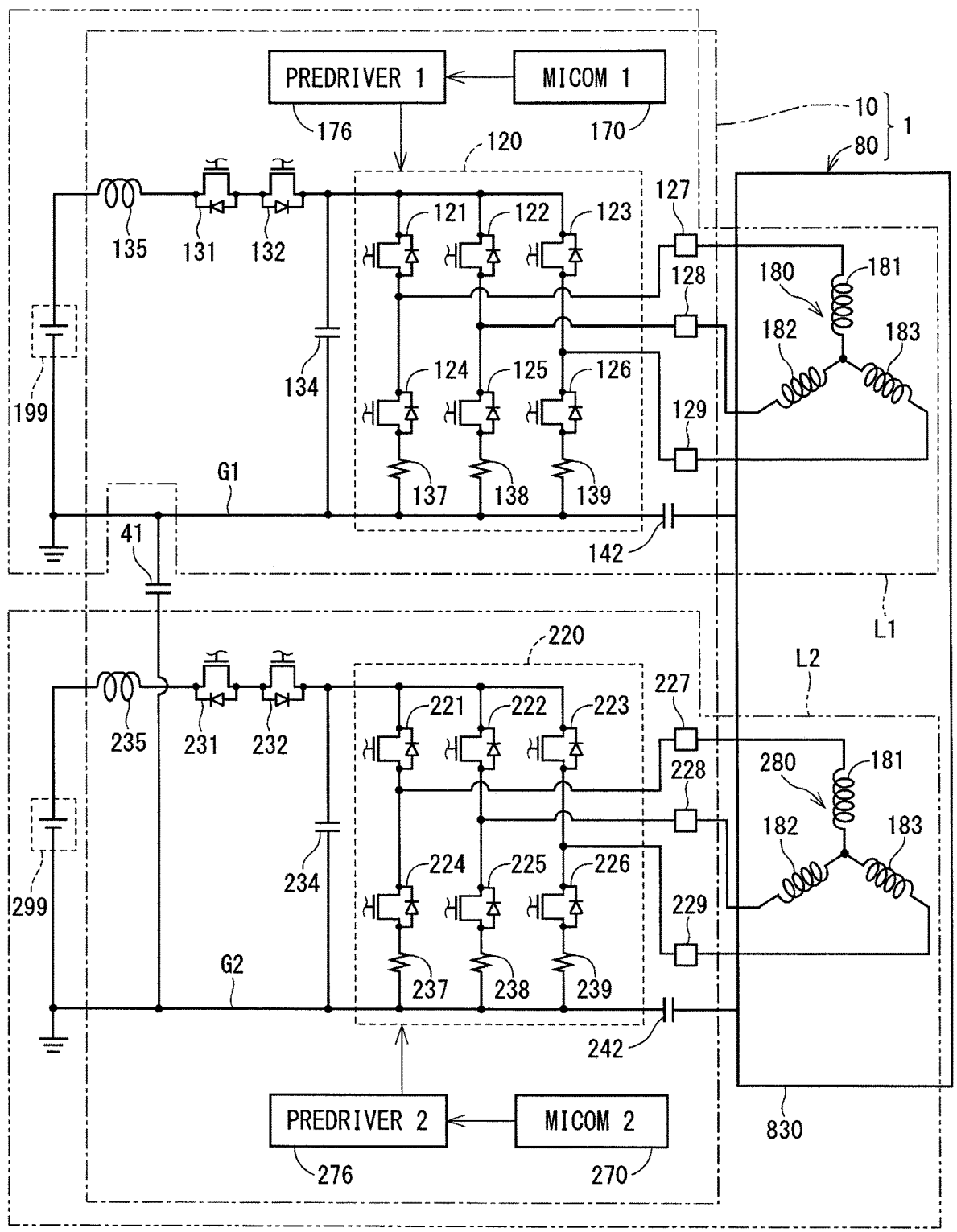
FIG. 4 illustrates a circuit diagram of the drive device in the first embodiment.

As shown in FIGS. 2, 3, and 4, the motor 80 is a three-phase brushless motor. The motor 80 outputs part or all of the torque for the power steering assist. Electric power is supplied to the motor 80 from batteries 199 and 299 to rotate the speed reduction gear 89 in both forward and reverse directions.

The motor 80 has a first motor winding 180 and a second motor winding 280. The first motor winding 180 may be a first winding set, for example, with windings corresponding to each of the three phases (e.g., a U-phase, a V-phase, and a W-phase). Similarly, the second motor winding 280 may be a second winding set. The motor windings 180 and 280 have the same electrical characteristics and are cancel-wounded on the common stator 840 with their electrical angles shifted from each other by 30 degrees. In response to such a configuration, the motor windings 180 and 280 are respectively controlled to receive a supply of phase current having a phase shift of 30 degrees between the phases. By optimizing the phase difference of the supply current, the output torque can be improved. The sixth harmonic (e.g., the sixth harmonic distortion) in the torque ripple can also be reduced by optimizing the phase difference. Since the electric current is averaged by the phase difference supply, the amount of electrical noise and vibration that can be cancelled is maximized. Since heat generation is also averaged, the temperature dependent intersystem errors that occur in the detection values of the sensors (e.g., torque values detected by torque sensors) can be reduced, and the amount of electric current that can be supplied is also averaged. Each of the motor windings 180 and 280 may also be referred to as a "winding set," e.g., the first winding set 180.

A combination of configurations of components relating to the energization (e.g., power supply) control of the first motor winding 180 is referred to as a first system L1, and a combination of configurations of components relating to the energization control of the second motor winding 280 is referred to as a second system L2. The components of the first system L1 is numbered in the 100s to distinguish the components of the first system L1 from the components of the second system L2 that are numbered in the 200s. For like components and features among the first system L1 and second system L2, the least significant digits or the lower two digits of the reference numbers are the same. For example, the first motor winding 180 in the first system L1 has a "1" as the most significant digit, signifying it belongs to the first system L1. The second motor winding 280 in the second system L2 has a "2" as the most significant digit signifying it belongs to the second system L2. The least significant digits for the motors windings 180 and 280 are "80" signifying that the motor windings 180 and 280 are similar to one another. As such, given a description of the first motor winding 180, the description of the second motor winding 280 may be omitted, unless there are differences between the motor windings 180 and 280 worth noting. In the drawings the suffix "1" as added to L1 indicates the first system L1, and the suffix "2" as added to L2 indicates the second system L2.

As shown in FIGS. 2 and 3, the drive device 1 may be an "electro-mechanical integrated type" drive device 1 in which the ECU 10 is included integrally on one side of the motor 80 in the axial direction. In the other words, the ECU 10 packaged together with the motor 80 as one device where the ECU 10 is disposed coaxially with an axis Ax of the shaft 870 on an opposite side of the output shaft of the motor 80. However, the ECU 10 may be disposed on an output shaft side of the motor 80. By adopting the electro-mechanical integrated type configuration, the ECU 10 and the motor 80 can be efficiently arranged in a vehicle where mounting space is strictly limited. An "axial direction" may mean in a longitudinal direction of the motor 80 along the axis Ax and a "radial direction" may mean in a radial direction relative to the axis Ax (i.e., in a direction substantially perpendicular or normal to the axis Ax).

The motor 80 includes the stator 840, a rotor 860, and a housing 830 for accommodating the stator 840 and the rotor 860. The stator 840 is fixed to the housing 830, and the motor windings 180 and 280 are wound on the stator 840. The rotor 860 is disposed at a position that is radially inward from the stator 840 and closer to the axis Ax, and can rotate relative to the stator 840.

The shaft 870 is inserted into the rotor 860 and rotates integrally with the rotor 860. The shaft 870 is rotatably supported by the housing 830 with bearings 835 and 836. The end of the shaft 870 on the ECU 10 side protrudes from the housing 830 toward the ECU 10. A magnet 875 is included at the end of the shaft 870 on the ECU 10 side. The magnet 875 is a detection target that can be used to detect, for example, the rotation position of the shaft 870, and thus the position of the attached rotor 860 as well.

Figure 5:
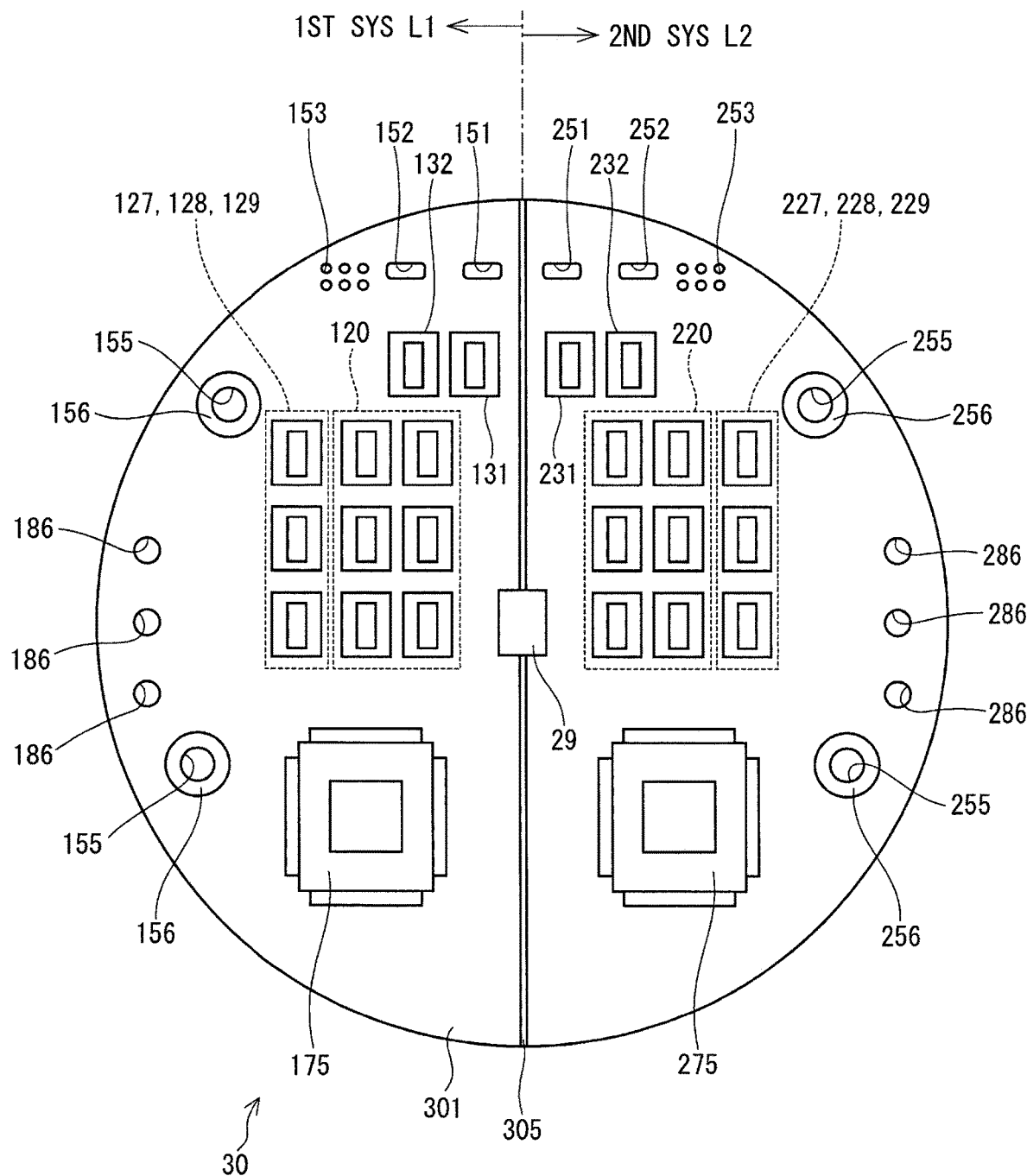
FIG. 5 illustrates a plan view of a motor surface of the substrate in the first embodiment.
Figure 6:
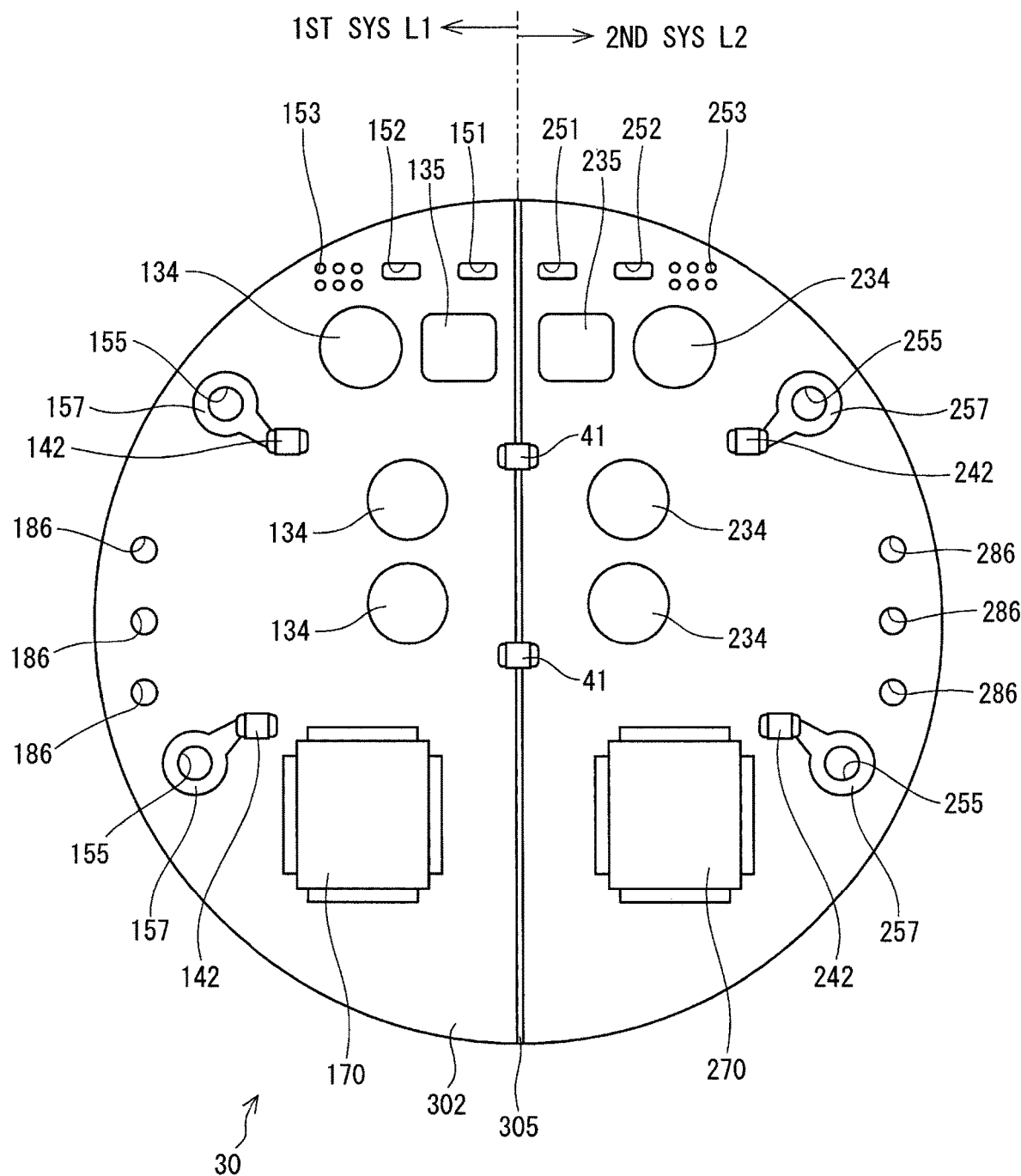
FIG. 6 illustrates a plan view of a cover surface of the substrate in the first embodiment.

The housing 830 has a cylinder-shaped case 834, a rear frame end 837 disposed at one end of the case 834, and a front frame end 838 disposed at the other end of the case 834. One or more lead wire insertion holes 839 is/are formed in the rear frame end 837. Lead wires 185 and 285 that connect to the different phases of the motor windings 180 and 280, respectively, are inserted into the lead wire insertion holes 839. The lead wires 185 and 285 extend respectively from the motor windings 180 and 280 and through the lead wire insertion holes 839 toward the ECU 10. The lead wires 185 and 285 are then respectively inserted into motor wire connection portions 186 and 286, as shown in FIGS. 5 and 6, and are connected to the substrate 30 by solder or a like electrical bonding material/process.

Figure 9:
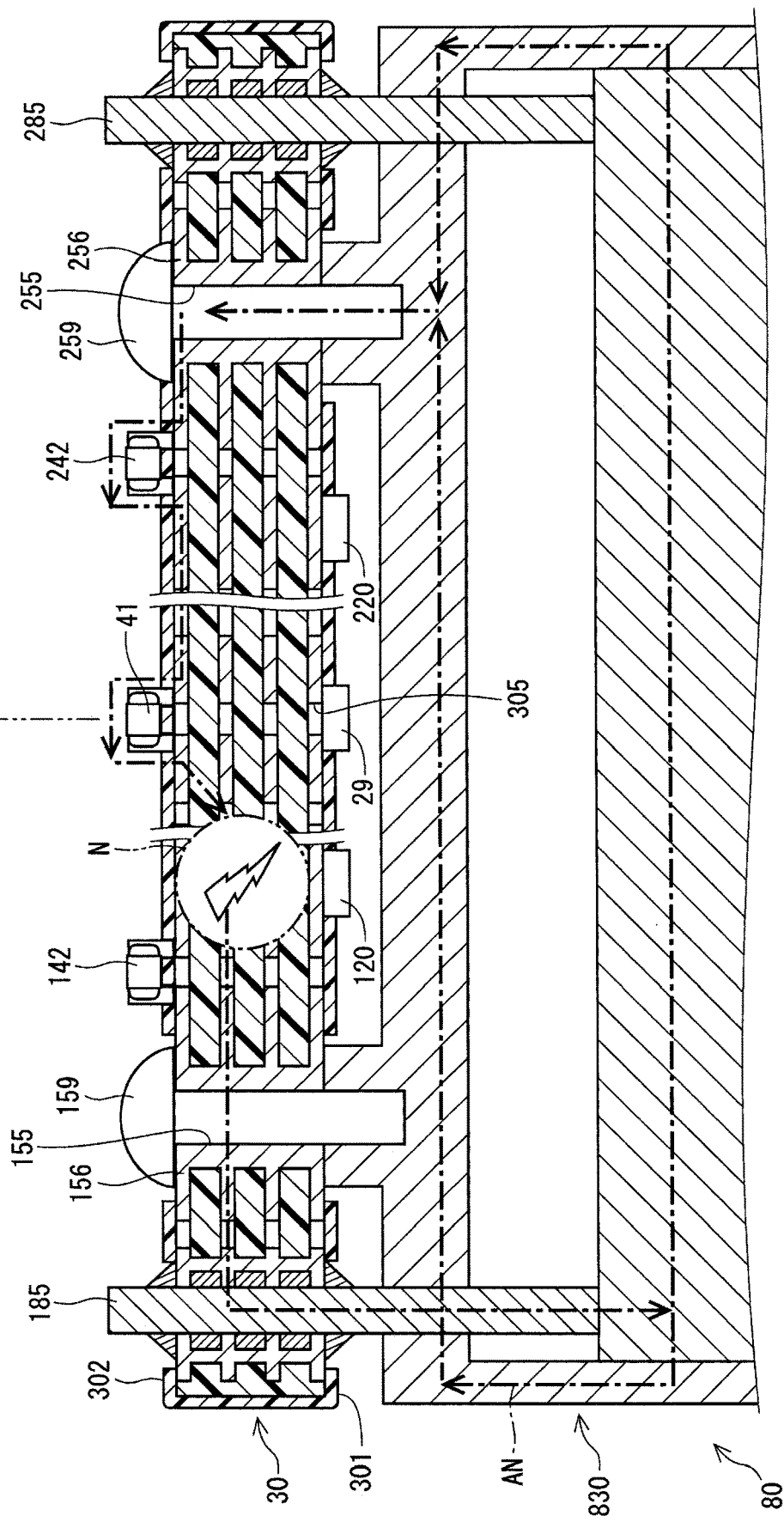
FIG. 9 illustrates a cross-sectional view of a part of the drive device illustrating the noise propagation path in the first embodiment.

The ECU 10 includes the substrate 30 and various electronic components mounted on the substrate 30. The substrate 30 is fixed to a surface of the rear frame end 837 that is opposite the motor 80 by bolts 159 and 259 inserted into substrate connection portions 155 and 255, as shown in FIG. 9. The bolts 159 and 259 are made of a conductive material. A surface of the substrate 30 on the motor 80 side (i.e., facing the motor 80) is referred to as a motor surface 301, and the other surface of the substrate opposite the motor 80 (i.e., facing a cover 460) is referred to as a cover surface 302.

The cover 460 is formed in a cylindrical shape with a bottom, and fits on a radial outer side of the rear frame end 837. That is, the cover 460 covers and attaches to a peripheral edge of the rear frame end 837, for example, as shown in FIG. 3. The cover 460 covers the substrate 30, and protects the ECU 10 from an external impact, and prevents the ingress of dust, water, and like contaminants into the inside portion of the cover 460 that covers the ECU 10. An opening 461 is provided on one side of the cover 460.

The connector 35 has a base portion 351 and a connector portion 355. As viewed from the side, for example in FIG. 2, the connector 35 is formed to be substantially L-shape. The base portion 351 is fixed to the substrate 30 by bolts or the like, and one end of the connector 35 that is opposite to the side where a connector terminal 36 extends radially outward from the opening 461 of the cover 460. The opening 461 is fitted to an outer face of a flange 352 included on an outer wall of the base portion 351.

The connector portion 355 is disposed outside the cover 460 on the motor 80 side and extends in the axial direction Ax relative to the base portion 351. The connector portion 355 includes an opening at one end that is also oriented in the axial direction. A wire harness or like wiring assembly can be inserted into the opening of the connector portion 355 and removed to connect and disconnect the wiring assembly to the drive device 1. The connector portion 355 may be divided into a first connector portion connected to the first system L1 and a second connector portion connected to the second system L2.

As shown in FIG. 2, the connector terminal 36 protrudes radially from an inner face of the base portion 351 and bends at about a 90 degree angle to connect to the substrate 30 of the ECU 10. The connector terminal 36 includes a first power terminal, a first ground terminal, a first signal terminal, a second power terminal, a second ground terminal, and a second signal terminal (all not shown). The first power terminal, the first ground terminal, the first signal terminal, the second power terminal, the second ground terminal, and the second signal terminal are respectively inserted into a first power supply terminal connection portion 151, a first ground terminal connection portion 152, a first signal terminal connection portion 153, a second power supply terminal connection portion 251, a second ground terminal connection portion 252, and a second signal terminal connection 253, as shown in FIGS. 5 and 6. The terminals are inserted into their respective connection portions from the motor side of the substrate 30 and electrically connected to the substrate 30 after being inserted into their respective connection portions. Although the example shown in FIGS. 5 and 6 shows each of the systems L1 and L2 having six signal terminals, the number of terminals may be arbitrarily set and is not limited to six terminals per system.

FIG. 4 illustrates a circuit configuration of the drive device 1. The first system L1 of the ECU 10 includes: a first inverter 120 with switching elements 121, 122, 123, 124, 125, and 126 (i.e., 121-126) and resistors 137, 138, and 139 (i.e., 137-139); first motor relays 127, 128, and 129 (i.e., 127-129); first power supply relays 131 and 132; a first capacitor 134; and a first coil 135 provided in combination for the first motor winding 180. The second system L2 of the ECU 10 includes a second inverter 220 with switching elements 221-226 and resistors 237-239; second motor relays 227-229; second power supply relays 231 and 232; a second capacitor 234; and a second coil 235 provided in combination for the second motor winding 280. In the present embodiment, although the switching elements 121-126 and 221-226, the motor relays 127-129 and 227-229, the power supply relays 131, 132, 231, and 232, the capacitors 134 and 234, and the coils 135 and 235 are all mounted on one substrate 30, these components may be divided and mounted on a plurality of separate substrates. Each of the first inverter 120 and the second inverter 220 may also be referred to as a "drive circuit," e.g., the second drive circuit 220.

Electric power is supplied from a first battery 199 to the first inverter 120 and other electrical components in the first system L1, and electric power is supplied from a second battery 299 to the second inverter 220 and other electric components in the second system L2. Each of the first battery 199 and the second battery 299 may also be referred to as a "power supply," e.g., the first power supply 199 and the second power supply 299. In the present embodiment, a first system ground or return path G1 is provided, separately for the first system L1, and a second system ground G2 is provided separately for the second system L2. The energization of the first motor winding 180 is controlled by the first controller 170, and the energization of the second motor winding 280 is controlled by the second controller 270. The controllers 170 and 270 may be small computers (i.e., microcomputers) such as microcontrollers or systems on a chip (SoCs).

In the present embodiment, the first system L1 and the second system L2 are provided as completely redundant configurations so that the drive device 1 has two redundant control systems.

The first inverter 120 is a three-phase inverter, and the first switching elements 121-126 are connected in a bridge configuration. The switching elements 121-123 are connected to a high potential side of the bridge, and the switching elements 124-126 are connected to a low potential side of the bridge. A connection point of the paired U-phase switching elements 121 and 124 is connected to one end of a first U-phase coil 181, a connection point of the paired V-phase switching elements 122 and 125 is connected to one end of a first V-phase coil 182, and a connection point of the paired W-phase switching elements 123 and 126 is connected to one end of a first W-phase coil 183. The coils 181, 182, and 183 (i.e., 181-183) may be configured in a wye configuration where the other ends of the coils 181-183 are connected to each other at a common neutral point. Shunt resistors 137, 138, and 139 are respectively connected to the switching elements 124-126 on the low potential side. The shunt resistors 137-139 serve as current detection elements for respectively detecting the electric current in the coils 181-183.

The second inverter 220 is a three-phase inverter, and the second switching elements 221-226 are connected in a bridge configuration. The switching elements 221-223 are connected to a high potential side and the switching elements 224-226 are connected to a low potential side. A connection point of the paired U-phase switching elements 221 and 224 is connected to one end of the second U-phase coil 281, a connection point of the paired V-phase switching elements 222 and 225 is connected to one end of the second V-phase coil 282, and the connection point of the paired W-phase switching elements 223 and 226 is connected to one end of the second W-phase coil 283. The other ends of the coils 281-283 are configured in a Wye configuration where the other ends of the coils 281-283 are connected to each other at a single, neutral connection point. Shunt resistors 237-239 are respectively connected to the low potential side switching elements 224-226 and serve as current detection elements for respectively detecting the electric current in the coils 281-283.

The first motor relays 127-129 are disposed at positions between the first inverter 120 and the first motor winding 180. The first motor relays 127-129 open and close (e.g., switch ON and OFF) to connect and disconnect the first inverter 120 to/from the first motor winding 180. The U-phase motor relay 127 is disposed at a connection point between the switching elements 121 and 124 and the U-phase coil 181, the V-phase motor relay 128 is disposed at a connection point between the switching elements 122 and 125 and the V-phase coil 182, and the W-phase motor relay 129 is disposed at a connection point between the switching elements 123 and 126 and the W-phase coil 183.

The second motor relays 227-229 are disposed at positions between the second inverter 220 and the second motor winding 280. The second motor relays 227-229 open and close (e.g., switch ON and OFF) to connect and disconnect the second inverter 220 to/from the second motor winding 280. The U-phase motor relay 227 is disposed at a connection point between the switching elements 221 and 224 and the U-phase coil 281, the V-phase motor relay 228 is disposed at a connection point between the switching elements 222 and 225 and the V-phase coil 282, and the W-phase motor relay 229 is disposed at a connection point between the switching elements 223 and 226 and the W-phase coil 283.

The first power supply relays 131 and 132 are connected in series so that the parasitic diodes of the relays 131 and 132 are arranged in opposite directions of one another. The power supply relays 131 and 132 are disposed at a position between the first battery 199 and the first inverter 120. The second power supply relays 231 and 232 are connected in series so that the parasitic diodes of the relays 231 and 232 are arranged in opposite directions of one another. The power supply relays 231 and 232 are disposed at a position between the second battery 299 and the second inverter 220.

By connecting the parasitic diodes of the relays 131 and 132 and the relays 232 and 232 in opposite directions, such a configuration can prevent the flow of reverse current, even when the batteries 199 and 299 are connected in the reverse direction, to protect the ECU 10.

In the present embodiment, the switching elements 121-126, the switching elements 221-226, the motor relays 127-129, the motor relays 227-229, and the power supply relays 131, 132, 231, and 232 may all be metal-oxide-semiconductor field-effect transistors (MOSFETs), but they may also be IGBTs, thyristors, or like switching elements. The power supply relays 131, 132, 231, and 232 may be mechanical relays.

The turning ON and OFF of the first switching elements 121-126, the first motor relays 127-129, and the first power supply relays 131 and 132 is controlled by a drive signal that is output from a predriver 176 based on a control signal from the first controller (i.e., microcomputer) 170. The turning ON and OFF of the second switching elements 221-226, the second motor relays 227-229, and the second power supply relays 231 and 232 is controlled by a drive signal that is output from a predriver 276 based on a control signal from the second controller 270. The control lines to the motor relays and the power supply relays are omitted from the drawings.

The first capacitor 134 is connected in parallel with the first inverter 120, and the second capacitor 234 is connected in parallel with the second inverter 220. The capacitors 134 and 234 may be, for example, aluminum electrolytic capacitors.

The first coil 135 is disposed at a position between the first battery 199 and the first power supply relay 131, and the second coil 235 is disposed at a position between the second battery 299 and the second power supply relay 231.

The first capacitor 134 and the first coil 135 form a filter circuit to reduce noise transmitted (i.e., incoming) from other electrical devices/components sharing the battery 199 and to reduce the noise transmitted from the drive device 1 to the other devices/components sharing the battery 199. Likewise, the second capacitor 234 and the second coil 235 form a filter circuit to reduce noise transmitted from other electrical devices/components sharing the battery 299 and to reduce the noise transmitted from the drive device 1 to the other devices/components sharing the battery 299. The capacitors 134 and 234 can also respectively assist the power supplied to the inverters 120 and 220 by storing electric charge.

An inter-system ground connection capacitor 41 between the first system L1 and the second system L2 connects a first system ground G1 and a second system ground G2. A first electro-mechanical connection capacitor 142 connects the first system ground G1 to the housing 830 of the motor 80. A second electro-mechanical connection capacitor 242 connects the second system ground G2 to the housing 830. The capacitors 41, 142, 242 may be, for example, chip or integrated circuit (IC) capacitors.

The motor surface 301 of the substrate 30 is described with reference to FIG. 5 and the cover surface 302 of the substrate 30 is described with reference to FIG. 6. For the sake of illustration, the arrangement of the cover surface 302 is reversed, and in each of FIGS. 5 and 6, the left sides of the drawings show the first system L1 and the right sides show the second system L2. The same applies to FIG. 8.

As shown in FIG. 5, the switching elements 121-126 and 221-226, the motor relays 127-129, the power supply relays 131, 132, 231, and 232, integrated circuits (ICs) 175 and 275, and a rotation angle sensor 29 are mounted on the motor surface 301 of the substrate 30. The IC 175 includes the predriver 176, and the IC 275 includes the predriver 276.

As shown in FIG. 6, the capacitors 134 and 234, the coils 135 and 235, the inter-system ground connection capacitor 41, the electro-mechanical connection capacitors 142 and 242, and the controllers 170 and 270 are mounted on the cover surface 302 of the substrate 30.

As shown in FIGS. 5 and 6, the substrate 30 is electrically separated into two parts by a slit 305, and the components of the first system L1 are mounted on the motor surface 301 and the cover surface 302 on one part of the substrate 30 on one side of the slit 305, and the components of the second system L2 are mounted on the motor surface 301 and the cover surface 302 on another part of the substrate 30 on the other side of the slit 305. The rotation angle sensor 29 is mounted on the motor surface 301 across the slit 305 (i.e., in a bridging manner). The inter-system ground connection capacitor 41 is mounted across the slit 305 on the cover surface 302 (i.e., in a bridging manner) to connect the first system ground G1 to the second system ground G2.

On the motor surface 301, annular-shaped housing connection patterns 156 and 256 are exposed from a surface resist layer at outer edges of the substrate connection portions 155 and 255.

Similarly, on the cover surface 302, housing connection patterns 157 and 257 are exposed from the surface resist layer at outer edges of the substrate connection portions 155 and 255. Parts of the housing connection patterns 157 and 257 are annular-shaped with an exposed annular portion from the surface resist layer. An exposed strip-shaped capacitor connection portion extends from the annular portion in a direction on the cover surface 302 corresponding to where the inverters 120 or 220 are disposed on the opposite, motor surface 301 of the substrate 30.

The connection patterns 156 and 157 are formed at the same, corresponding positions on the motor surface 301 and cover surface 302 of the substrate. The connection patterns 156 and 157 are electrically connected by through hole lands/barrels formed on inner wall surfaces of the substrate connection portions 155. The through hole lands or through hole barrels may refer to electrically conductive material disposed on the inside of the through holes where the land/barrels extends from the connection pattern 156 through the substrate to the connection pattern 157 to electrically connect the connection patterns 156 and 157. On account of being electrically connected, the connection patterns 156 and 157 have the same potential. Similarly, the patterns 256 and 257 formed at the same, corresponding positions on the substrate 30 and are connected by through hole lands formed on the inner wall surfaces of the substrate connection portions 255, and thus have the same potential.

The housing connection patterns 156, 157, 256, 257 are electrically connected to the housing 830 by the bolts 159 and 259. That is, the bolts 159 and 259 respectively serve as electro-mechanical connection members that electrically connect the housing connection patterns 156, 157, 256 and 257 of the substrate 30 to the housing 830. While the connecting members described in this example are the bolts 159 and 259, the housing connection patterns 156, 157, 256, and 257 may be connected to the housing 830 by a member other than the bolts 159 and 259.

The housing connection patterns 156, 157, 256, and 257 are electrically connected to the housing 830, and have the same potential. Slits (not shown) are additionally formed over the entire periphery at/around the outer edges of the housing connection patterns 156, 157, 256, and 257, to electrically separate (i.e., isolate/insulate) patterns 156, 157, 256, and 257 from other wiring patterns on the substrate 30. That is, the patterns 156, 157, 256, and 257 are in a "floating" state, for example, having a floating ground or a floating voltage.

The first electro-mechanical connection capacitor 142 connects the ground pattern of the first system L1 and the housing connection pattern 157. That is, the first system ground G1 is electrically connected to the housing 830 via the first electro-mechanical connection capacitor 142. The second electro-mechanical connection capacitor 242 connects the ground pattern of the second system L2 and the housing connection pattern 257. That is, the second system ground G2 is electrically connected to the housing 830 via the second electro-mechanical connection capacitor 242. The housing 830 is connected to a vehicle ground (e.g., a chassis ground). That is, each of the capacitors 41, 142, and 242 serves as the one connection between the systems L1 and L2, and the systems L1 and L2 and the grounds G1 and G2. The inter-system ground connection capacitor 41 is, in other words, connecting the grounds G1 and G2 of the power circuits of the first and second systems L1 and L2.

In the present embodiment, the drive device 1 may be used in the electric power steering device 8, and as such, large currents may flow through the drive device 1 that consequently generates switching noise and ringing noise. The source of such noise N is mainly in the circuits of the ECU 10, and the generated noise N may propagate to the vehicle side via the connector 35 and the motor 80. As a reference example, in instances where a filter is provided to limit and/or prevent the propagation of noise from the connector 35 to the outside of the drive device 1, such a filter may need changes in the filter constant or additional elements to be effective, thus resulting in an increased size and cost of such a filter, and the drive device 1 as a whole.

By electrically connecting the ground of the substrate 30 and the housing 830 using the bolts 159 and 259, such a connection forms a noise return path to collect and return the noise N from the motor 80 side to the ECU 10 side, to limit and/or prevent further propagation of the noise to the vehicle 99.

In the present embodiment, the first system L1 and the second system L2 are separated on the substrate 30 by the slit 305, including the separation of the connector terminals 36. On the other hand, the housing 830 of the motor 80 is shared among the two systems L1 and L2. With reference to the reference example of FIG. 13, if no inter-system ground connection capacitor 41 is provided, as shown by the one-dot-one-dash arrow AN1, although a portion of the noise N generated in the first inverter 120 may return to the ECU 10 in the system, other portions of the noise N may propagate to the vehicle 99 via a stray capacitance Cs of the motor 80, via the second system ground G2, via the connector 35 (not shown in FIG. 13), and by way of the housing 830 and the second system L2, as shown by the dotted line arrow AN3.

Similarly, the noise generated in the second inverter 220 may also propagate to the vehicle 99 via the first system ground G1 and the connector 35. Since the noise return path is the same among the systems L1 and L2, the configurations of the first system L1 and the second system L2 may be interchanged. As such, the following description mainly describes the return path of the noise generated in the first system L1.

Figure 7:
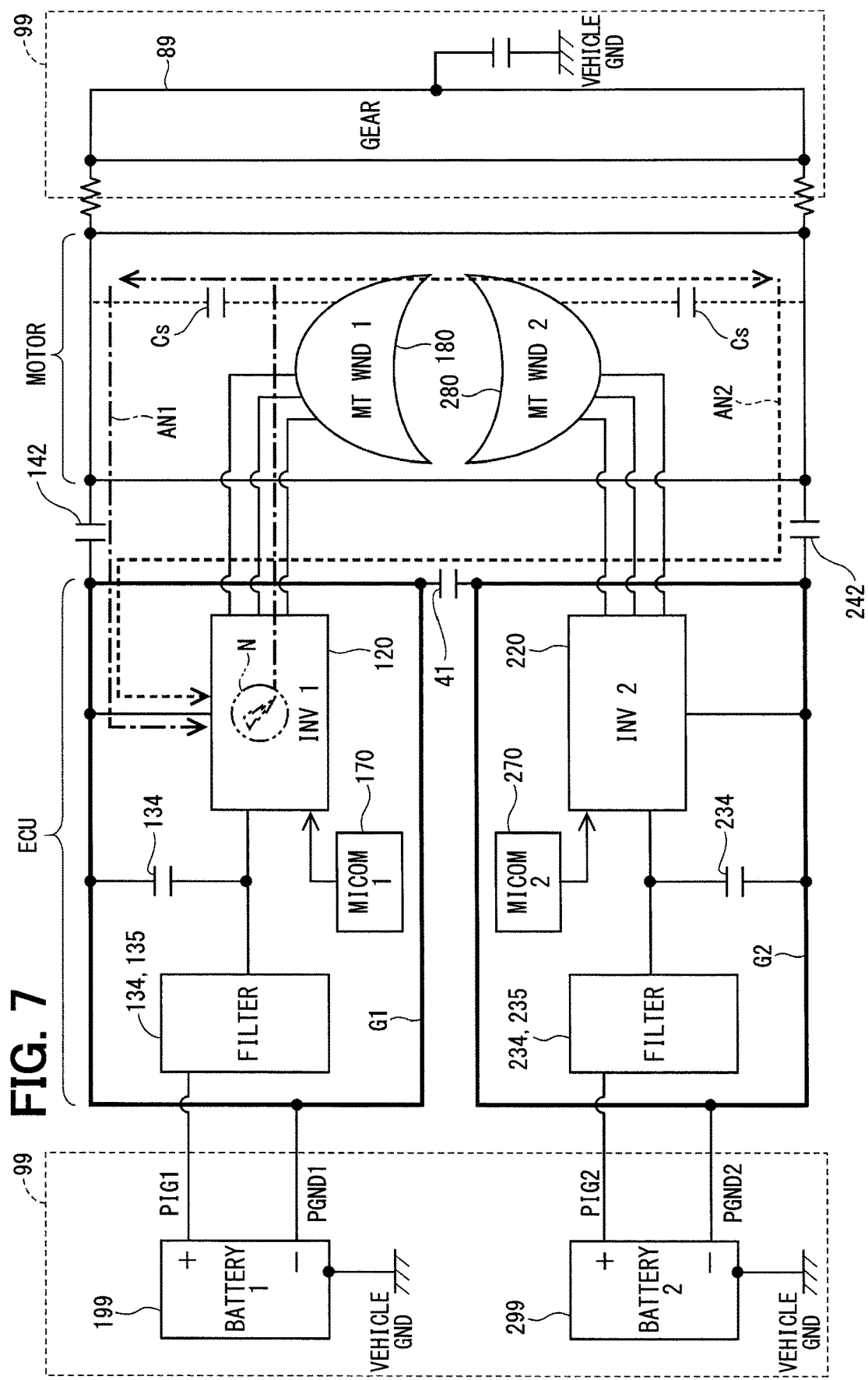
FIG. 7 illustrates a noise propagation path for a circuit schematic in the first embodiment.
Figure 13:
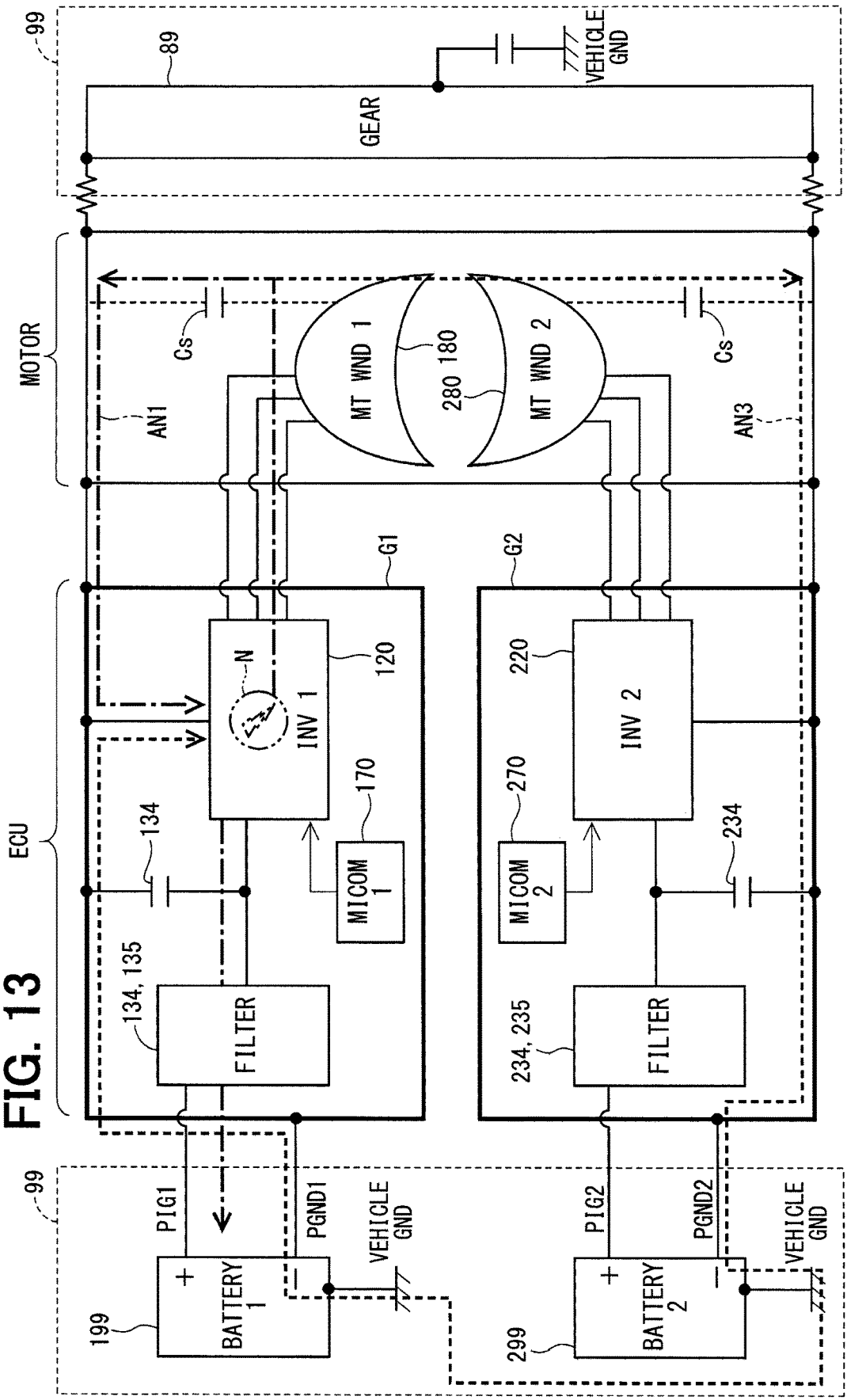
FIG. 13 is a reference example of related technology illustrating a noise propagation path in a circuit schematic.

As shown in FIG. 7, in the present embodiment, the grounds G1 and G2 of the respective systems are connected to the housing 830 of the motor 80 by the electro-mechanical connection capacitors 142 and 242, and the grounds G1 and G2 are also connected by the inter-system connection capacitor 41. On account of this configuration, the noise generated in the first system L1 and propagated to the second system L2 in the motor 80 is transmitted via the electro-mechanical connection capacitor 242 and the inter-system ground connection capacitor 41, as shown by the dotted line arrow AN2, to return to the noise source in the first system L1. In FIGS. 7 and 13, portions indicated by thick lines are at the same potential as the grounds G1 and G2. The capacitor 134 and the coil 135 that make up a filter circuit in the first system L1 and the capacitor 234 and the coil 235 that make up the filter circuit in the second system L2 may be collectively referred to as a "filter."

Figure 8:
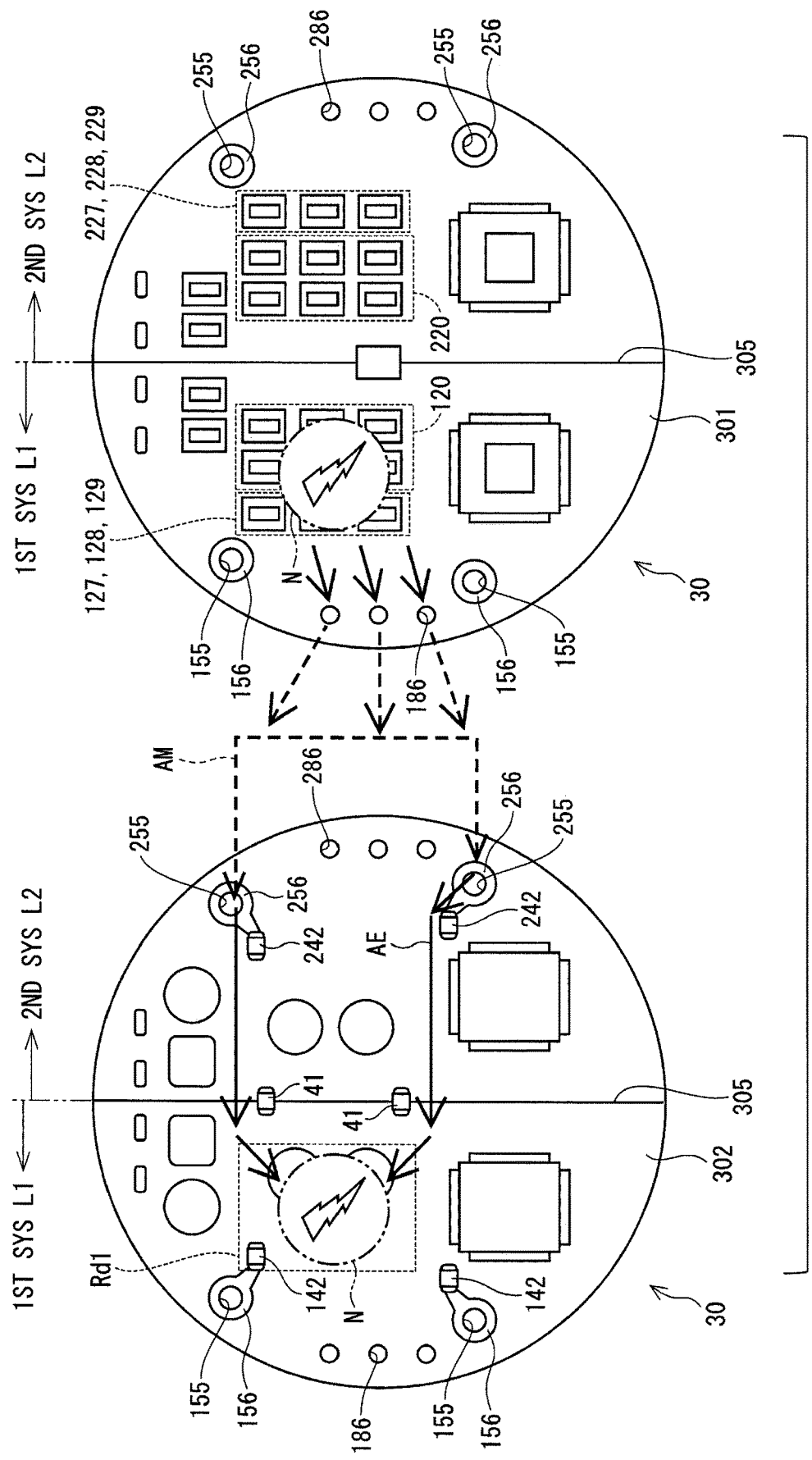
FIG. 8 illustrates the noise propagation path on the substrate in the first embodiment.

With reference to FIGS. 8 and 9, noise return paths in the drive device 1 are shown. Some configurations and reference numerals may be omitted from FIG. 8 to simplify the description. Similarly, FIG. 9 is a schematic cross-sectional view for illustration purposes, and may not accurately reflect an actual arrangement of components. In FIG. 8, a typical noise propagation path inside the ECU 10 is indicated by the solid line arrow AE, and a typical noise propagation path on the motor 80 side is indicated by the broken line arrow AM. The same solid line arrow/broken line arrow convention applies to FIG. 11 and FIG. 12 described later. In FIG. 9, a typical noise propagation path in the drive device 1 is indicated by a one-dot-one-dash line arrow AN.

As shown in FIGS. 8 and 9, the noise generated in the first inverter 120 propagates to the housing 830 via the lead wire 185, the motor winding 180 and the stray capacitance of the motor 80. Here, the noise propagated to the second system L2 via the housing 830 returns to the first system L1 side, i.e., toward the noise source, on the substrate 30 via the bolt 259, the electro-mechanical connection capacitor 242, the wiring pattern of the substrate 30, and the inter-system ground connection capacitor 41.

The number of inter-system ground connection capacitors 41 and electro-mechanical connection capacitors 142 and 242 may be determined based on the generated noise. The inter-system ground connection capacitor 41 is disposed at a position where the capacitor 41 can be connected to the housing connection patterns 156 and 256 with a low impedance. As shown in FIG. 8, the inter-system ground connection capacitor 41 is disposed at a position between the substrate connection portion 255 in the second system L2 and a drive circuit area Rd1 of the first system L1, that is, at a position bridging one of the substrate connection portions 255 provided in an area of the second system L2 and a drive circuit area Rd1 of the first system L1. The drive circuit area Rd1 is an area on the cover surface 302 corresponding to a position where the switching elements 121-126 and the motor relays 127-129 are mounted on the motor surface 301. That is, the drive circuit area Rd1 on the cover surface 302 is a projection area overlying an area in which various elements are mounted on the substrate 30.

The capacitors 41, 142, and 242 are preferably disposed at positions on the shortest path from the connection point between the substrate 30 and the housing 830 to the elements that are the noise sources (e.g., the switching elements 121-126 and 221-226). Here, the "shortest path" does not necessarily mean a path with the shortest distance, but may mean, for example, the shortest path that includes detours for avoiding components such as the controllers 170 and 270 (i.e., the microcomputers 170 and 270) that are susceptible to noise.

Also, as shown in FIG. 9, the housing connection patterns 156 and 256 are electrically connected to the housing 830 by surface contact. As a result, the impedance of the noise return path is reduced, thereby improving the noise reduction performance.

As described above, the drive device 1 according to the present embodiment includes the motor 80, the substrate 30, and at least one inter-system ground connection capacitor 41. The motor 80 has the motor windings 180 and 280 housed in the one, common housing 830. The substrate 30 has the plurality of inverters 120 and 220 mounted thereon. In the present embodiment, the switching elements 121-126 and 221-226 that are respectively part of the inverters 120 and 220 are surface mounted on one substrate 30, which is a one piece component. The inverters 120 and 220 are each respectively connected to the separate batteries 199 and 299 and the separate grounds G1 and G2. Specifically, the first inverter 120 is connected to the first battery 199 and the first system ground G1, and the second inverter 220 is connected to the second battery 299 and the second system ground G2.

A combination of the inverters 120 and 220, batteries 199 and 299, and the grounds G1 and G2 may be referred to as a system, e.g., the first system L1 and the second system L2. The inter-system ground connection capacitor 41 is mounted on the substrate 30 to electrically connect the grounds G1 and G2 of each system for providing a path on the substrate 30 to return the noise propagated to the other system via the motor windings 180 and 280 back to the subject system. Using such a configuration with the inter-system ground connection capacitor 41 limits and/or reduces the propagation of noise to the outside of the drive device 1.

On the substrate 30, the slit 305 is formed to separate the wiring patterns into two systems, e.g., the first system L1 and the second system L2. The inter-system ground connection capacitor 41 is mounted across the slit 305 in a bridging manner to bridge the slit 305. As such, even when each of the systems L1 and L2 is electrically isolated/insulated from the other on the substrate 30, the grounds of the respective systems can be connected by using the capacitor 41.

The inter-system ground connection capacitor 41 is disposed at a position (i.e., a bridging position) between the substrate connection portions 155 or 255 in either the first system L1 or the second system L2 connecting the substrate 30 and the housing 830 to an area or corresponding area on the substrate where the inverter 220 or 120 in a different system is disposed. More specifically, the inter-system ground connection capacitor 41 is disposed at a position between the substrate connection portion 255 in the second system L2 and the drive circuit area Rd1 corresponding to the area where the first inverter 120 is mounted. The inter-system ground connection capacitor 41 is disposed at a position between the substrate connection portions 155 in the first system L1 and a drive circuit area corresponding to the area where the second inverter 220 is mounted. In FIG. 8, the drive circuit area Rd1 includes the area where the motor relays 127-129 are mounted. However, the area where the motor relays 127-129 are mounted may be excluded from the drive circuit area Rd1. By using such a configuration, the noise propagated to the other system can be appropriately returned to the subject system via a low impedance pathway.

In the drive device 1, the electro-mechanical connection capacitors 142 and 242 connect the grounds of the respective systems on the substrate 30 to the housing connection patterns 156, 157, 256 and 257. The housing connection patterns 156, 157, 256, and 257 are separated from the other wiring patterns on the substrate 30, and are electrically connected to the housing 830. In such manner, a low impedance path is provided for returning the propagated noise from the motor 80 back to the ECU 10 including the inverters 120 and 220.

The drive device 1 of the present embodiment includes the motor 80, the substrate 30, and the electro-mechanical connection capacitors 142 and 242. The motor 80 includes a plurality of motor windings 180 and 280 housed in a common housing 830. The substrate 30 has a plurality of inverters 120 and 220 mounted on the substrate 30 that correspond to each of the motor windings 180 and 280.

The electro-mechanical connection capacitors 142 and 242 are mounted on the substrate 30 and electrically connect the ground patterns G1 and G2 of the substrate 30 and the housing 830. On the substrate 30, the housing connection patterns 156, 157, 256, and 257 that are electrically connected to the housing 830 are separated from the other circuit patterns on the substrate 30, and the electro-mechanical connection capacitors 142 and 242 connect the housing connection patterns 156, 157, 256, and 257 and the ground patterns of the substrate 30. By using such a configuration, a low impedance path is provided for returning the noise propagated to the motor 80 back to the ECU 10 including the inverters 120 and 220. As such, such a configuration can limit and/or prevent the propagation of noise outside of the drive device 1 to the rest of the vehicle 99.

The inverters 120 and 220 are respectively connected to separate batteries 199 and 299 and separate grounds G1 and G2. The drive device 1 further includes at least one inter-system ground connection capacitor 41. The inter-system ground connection capacitor 41 is mounted on the substrate 30 and electrically connects the grounds G1 and G2 of the respective systems. In other words, one ground specific to one system is connected to the other ground specific to the other system by the inter-system ground connection capacitor 41. Such a configuration provides a path on the substrate 30 for returning the noise propagated to the other system via the motor windings 180 and 280 back to the subject system.

The plurality of inverters 120 and 220 are mounted on a single substrate 30 that is fixed to one axial end of the housing 830. Such an arrangement can reduce the overall volume and dimensions of the drive device leading to an overall cost reduction of the drive device 1 (e.g., less material) and an overall space saving within the vehicle.

The electric power steering device 8 includes the drive device 1 and the speed reduction gear 89 as a power transmission unit. The motor 80 outputs a torque for steering the vehicle 99. In the electric power steering device 8, a large current is supplied to the drive device 1 and such a large current can generate a relatively large amount of switching and ringing noise in the drive device 1. Since the drive device 1 of the present embodiment has a path for returning the generated noise back to the noise source, the drive device 1 of the present embodiment can limit and/or prevent the noise transmission to the vehicle 99 via the speed reduction gear 89, the connector 35, and other components in the steering system 90.

Second Embodiment

Figure 10:
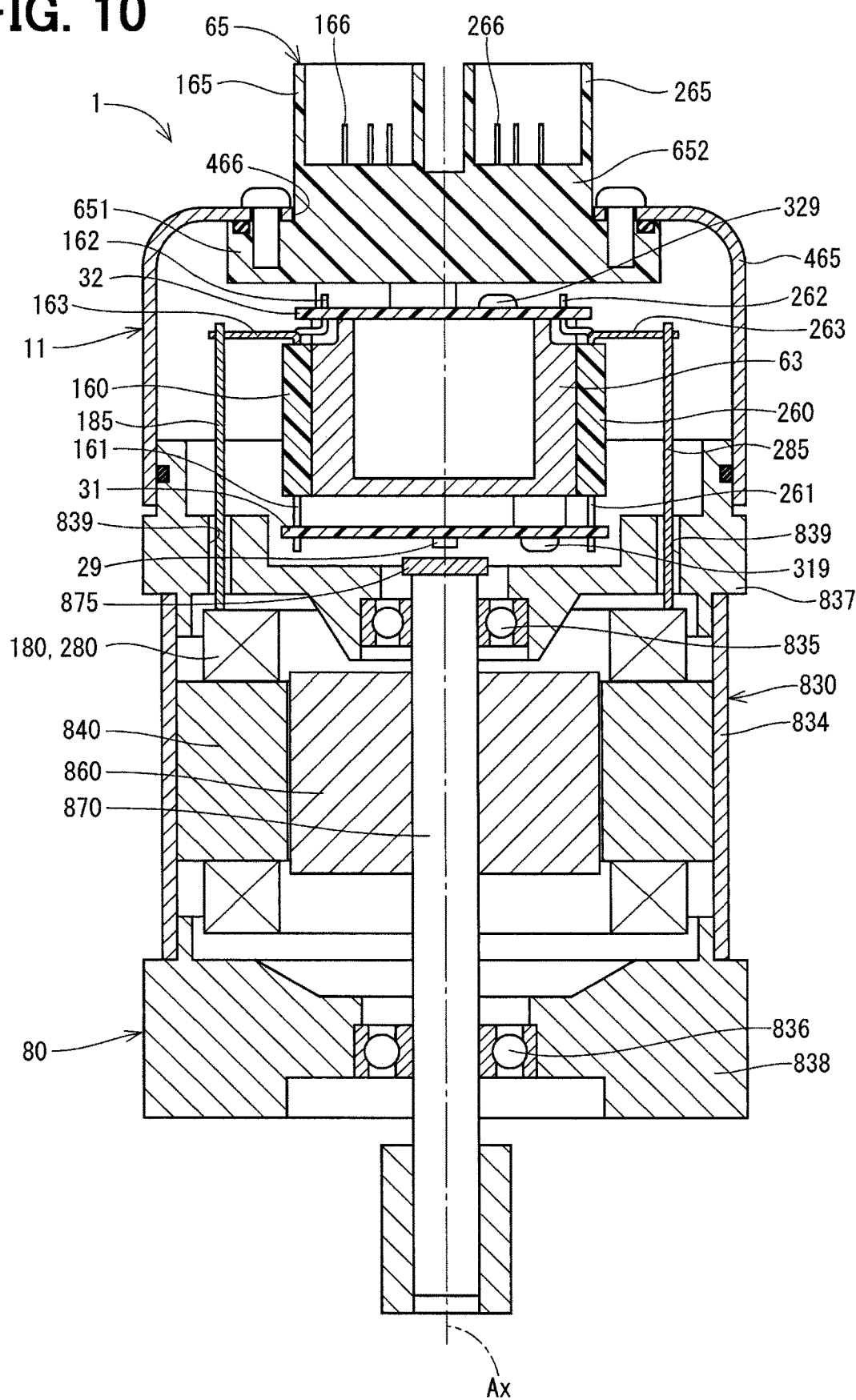
FIG. 10 illustrates a cross-sectional view of a drive device in a second embodiment of the present disclosure.

The second embodiment is described with reference to FIGS. 10, 11, and 12. An ECU 11 of the present embodiment includes a control substrate 31, a power substrate 32, a heat sink 63, and power modules 160 and 260. As shown in FIG. 10, a cylindrical shaped cover 465 is formed with a bottom and is configured to fit on the radial outer side of the rear frame end 837 near a periphery of the rear frame end 837. The cover 465 covers the substrates 31 and 32 and the power modules 160 and 260. As shown in FIG. 10, an opening 466 in the cover 465 is disposed on the side of the cover 465 opposite to where the cover 465 fits the periphery of the rear frame end 837.

A connector 65 has a base portion 651 and a connector portion 652. The base portion 651 is fixed to the cover 465 by a bolt or like fastener. The connector portion 652 axially protrudes from the opening 466 of the cover 465 to extend axially in a direction away from the motor 80. An opening of the connector portion 652 opens in the axial direction and a wiring harness (not shown) can be inserted into and removed from the open side of the connector portion 652. In FIG. 10, the connector portion 652 is in the upper part of FIG. 10 opposite to the motor 80. The connector portion 652 of the present embodiment is divided into a first connector portion 165 and a second connector portion 265. The first connector portion 165 includes a first connector terminal 166 connected to a first system L1, and the second connector portion 265 includes a second connector terminal 266 connected to a second system L2. The first connector terminal 166 includes a first power supply terminal, a first ground terminal, and a first signal terminal, and the second connector terminal 266 includes a second power supply terminal, a second ground terminal, and a second signal terminal.

Figure 11:
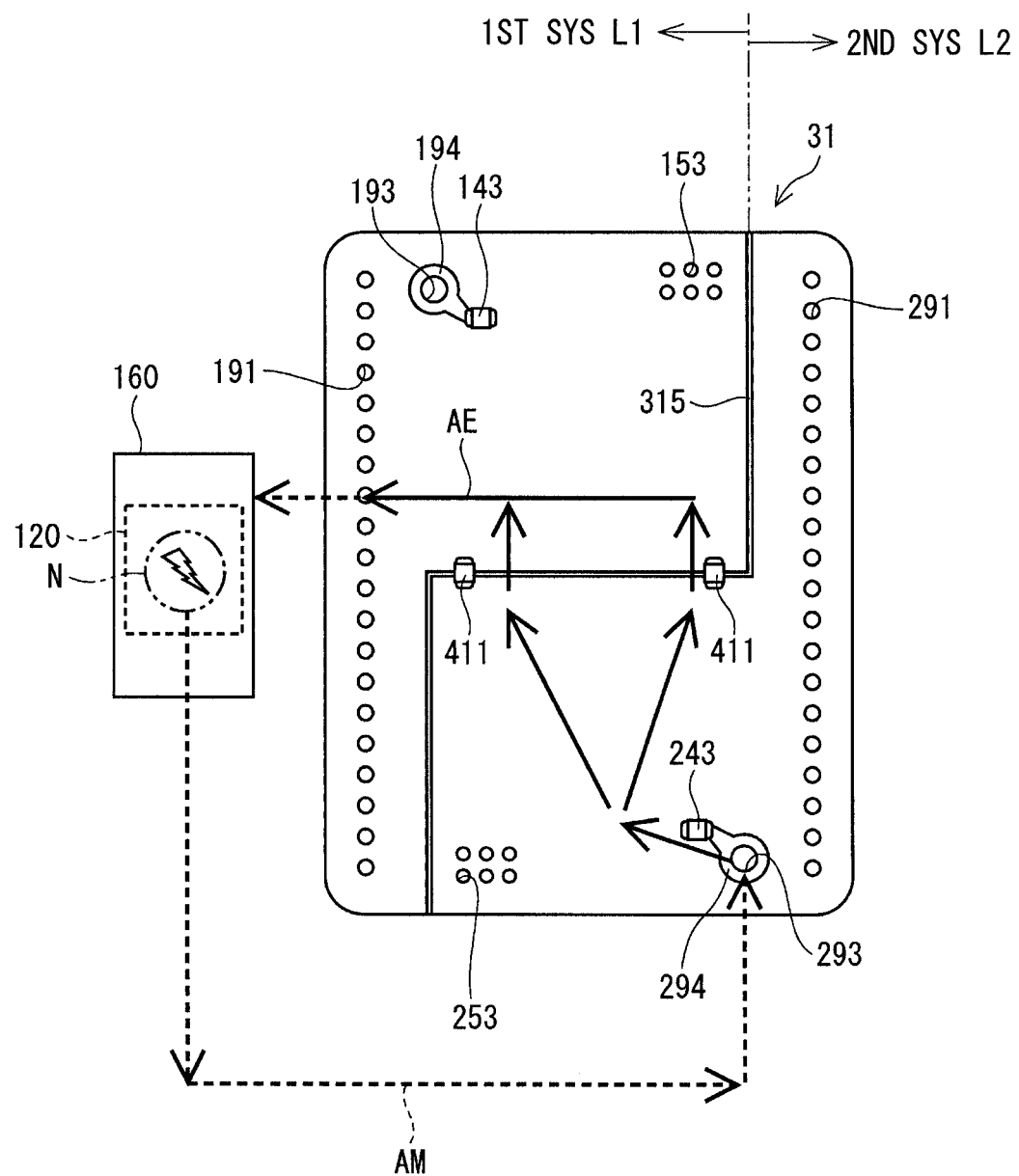
FIG. 11 illustrates a noise propagation path on a control substrate in the second embodiment of the present disclosure.

The control substrate 31 is formed in a substantially rectangular shape, and is fixed to a surface of the heat sink 63 on the motor 80 side by bolts 319 inserted through substrate connection portions 193 and 293, as shown in FIG. 11. The power substrate 32 is formed in a substantially rectangular shape, and is fixed to a surface of the heat sink 63 opposite to the motor 80 by bolts 329 inserted through substrate connection portions 195 and 295, as shown in FIG. 12. The heat sink 63 is fixed to the rear frame end 837 and has the same electrical potential as the housing 830. The heat sink 63 and the rear frame end 837 may be integrated together to have a singular body (i.e., as one structure), or may be configured to have separate bodies (i.e., as separate structures). The heat sink 63 is formed of, for example, a metal having high thermal conductivity such as aluminum, and the power modules 160 and 260 are disposed on side faces of the heat sink 63 to dissipate heat from the power modules 160 and 260 to the heat sink 63. As shown in FIG. 10, in the present embodiment, the power modules 160 and 260 are arranged vertically along the axial direction of the motor 80, for example, to maximize the surface area of the power modules 160 and 260 in contact with the heat sink 63 and minimize space.

The first power module 160 includes switching elements 121-126 and motor relays 127-129 that make up a first inverter 120. The second power module 260 includes switching elements 221-226 and motor relays 227-229 that make up a second inverter 220. Control terminals 161 and 261 connected to the control substrate 31 are disposed on the control substrate 31 side of the power modules 160 and 260. Power terminals 162 and 262 and motor terminals 163 and 263 are disposed on the power substrate 32 side of the power modules 160 and 260. The power terminals 162 and 262 are connected to the power substrate 32 and the motor terminals 163 and 263 are respectively connected to lead wires 185 and 285. The motor terminals 163 and 263 are bent in a direction away from the heat sink 63 and connected to the lead wires 185 and 285.

The control substrate 31 is described in greater detail with reference to FIG. 11, and the power substrate 32 is described in greater detail with reference to FIG. 12. Both of FIGS. 11 and 12 are plan views from the same side in the axial direction, and components other than inter-system ground connection capacitors 411 and 412 and electro-mechanical connection capacitors 143, 144, 243, 244 are omitted from the drawings. FIGS. 11 and 12 omit electrical components to better show the noise propagation path without overcomplicating the description of FIGS. 11 and 12. Controllers (i.e., microcomputers) 170 and 270 and integrated circuits (ICs) 175 and 275 (not shown in FIG. 11) are mounted on the control substrate 31. Power supply relays 131, 132, 231, and 232, capacitors 134 and 234, and coils 135 and 235 (all not shown in FIG. 12) are mounted on the power substrate 32. The control substrate 31 has the inter-system ground connection capacitor 411 and the electro-mechanical connection capacitors 143 and 243 mounted thereon, and the power substrate has the inter-system ground connection capacitor 421 and the electro-mechanical connection capacitors 144 and 244 mounted thereon. The electrical configuration of the ECU 11 in the present embodiment is the same as the configuration of the ECU 10 in the first embodiment.

As shown in FIG. 11, control terminal connection portions 191 and 291, signal terminal connection portions 153 and 253, and substrate connection portions 193 and 293 are formed on the control substrate 31. The first control terminal connection portions 191 are formed along one side of the substrate 31 where the first power module 160 is disposed. The control terminal 161 of the first power module 160 is inserted into the first control terminal connection portion 191 and is electrically connected to the control substrate 31 by solder or like bonding material. The second control terminal connection portions 291 are formed along the other side of the substrate 31 where the second power module 260 is disposed. The control terminal 261 of the second power module 260 is inserted into the second control terminal connection portion 291 and electrically connected to the control substrate 31 by solder or like bonding material.

The signal terminal connection portions 153 and 253 are formed on shorter sides of the control substrate 31 and are symmetrically arranged (e.g., glide symmetry, reflection symmetry) about the center of the control substrate 31. The substrate connection portions 193 and 293 are also formed symmetrically with respect to the center of the control substrate 31 at positions relatively close to corners of the substrate 31.

A slit 315 divides the control substrate 31 into two parts to electrically separate the control substrate 31 into two areas. In one of the two areas, the first control terminal connection portions 191, the first signal terminal connection portions 153, and the first substrate connection portion 193 related to the first system L1 are included. In the other of the two areas, the second control terminal connection portions 291, the second signal terminal connection portions 253, and the second substrate connection portion 293 related to the second system L2 are included. The inter-system ground connection capacitor 411 is mounted across the slit 315 to connect a first system ground G1 to a second system ground G2.

Housing connection patterns 194 and 294 are formed on outer edges of the substrate connection portions 193 and 293. The housing connection patterns 194 and 294 are exposed from the surface resist layer in a shape where a strip-shaped capacitor connection portion protrudes from an annular-shaped portion toward the center of the control substrate 31. The housing connection patterns 194 and 294 are electrically connected to the heat sink 63 by the bolts 319, as shown in FIG. 10. That is, the housing connection patterns 194 and 294 have the same potential as the housing 830. In addition, slits (not shown) are formed over the entire periphery at the outer edge of each of the housing connection patterns 194 and 294. As such, the patterns 194 and 294 are not connected to other wiring patterns on the substrate 31 and are in a "floating" state having, for example, a floating ground or a floating voltage.

The first electro-mechanical connection capacitor 143 is mounted on the control substrate 31, and connects the ground pattern of the first system L1 and the housing connection pattern 194. The second electro-mechanical connection capacitor 243 is mounted on the control substrate 31, and connects the ground pattern of the second system L2 and the housing connection pattern 294.

Figure 12:
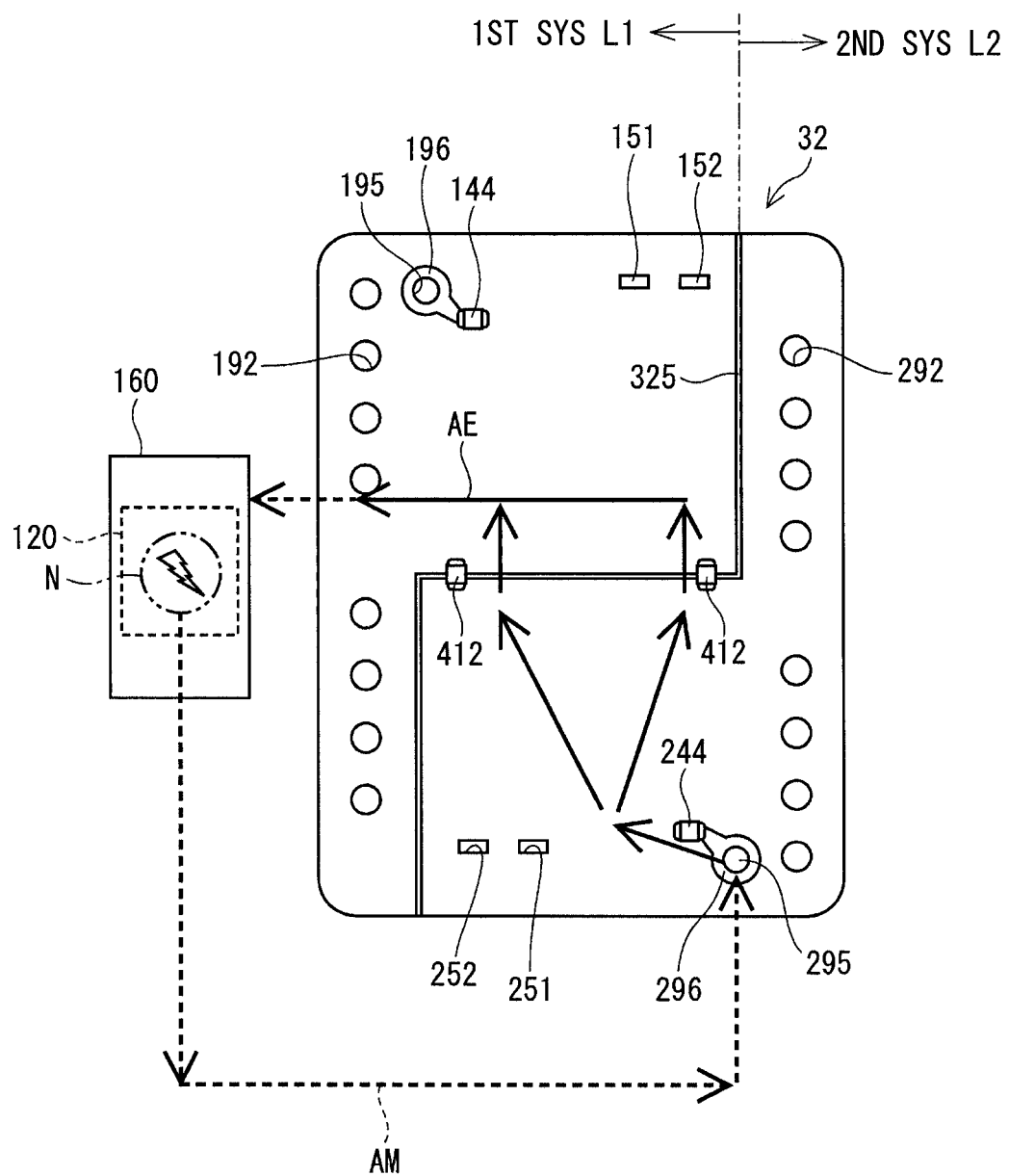
FIG. 12 illustrates a noise propagation path on a power substrate in the second embodiment.

As shown in FIG. 12, power terminal connection portions 192 and 292, power supply terminal connection portions 151 and 251, ground terminal connection portions 152 and 252, and the substrate connection portions 195 and 295 are formed on the power substrate 32. The first power terminal connection portions 192 are formed along one side of the substrate 32 where the first power module 160 is disposed. The power terminal 162 of the first power module 160 is inserted into the first power terminal connection portion 192 and is electrically connected to the power substrate 32 by solder or like bonding material. The second power terminal connection portion 292 is formed along the other side of the substrate 32 where the second power module 260 is disposed. The power terminal 262 of the second power module 260 is inserted into the second power terminal connection portion 292 and electrically connected to the power substrate 32 by solder or like bonding material.

The first power supply terminal connection portion 151 and the first ground terminal connection portion 152 are arranged side by side along a shorter side of the power substrate 32. The second power supply terminal connection portion 251 and the second ground terminal connection portion 252 are arranged side by side along the shorter side of the power substrate 32. The terminal connection portions 151 and 152 and the terminal connection portions 251 and 252 are disposed in a symmetrical manner (e.g., sliding symmetry, reflection symmetry) with respect to the center of the power substrate 32. The substrate connection portions 195 and 295 are also formed symmetrically with respect to the center of the power substrate 32 and at positions relatively close to the corners of the substrate 32.

A slit 325 divides the power substrate 32 into two parts to electrically separate the power substrate 32 into two areas. The first power terminal connection portions 192, the first power supply terminal connection portion 151, the first ground terminal connection portion 152, and the first substrate connection portion 195 related to the first system L1 are included in one of the two areas of the power substrate 32. The second power terminal connection portions 292, the second power supply terminal connection portion 251, the second ground terminal connection portion 252, and the second substrate connection portion 295 related to the second system L2 are included in the other of the two areas of the power substrate 32. The inter-system ground connection capacitor 412 is mounted across the slit 325, and connects the first system ground G1 and the second system ground G2.

Housing connection patterns 196 and 296 are formed at outer edges of the substrate connection portions 195 and 295. The housing connection patterns 196 and 296 are exposed from the surface resist layer in a shape where a strip-shaped capacitor connection portion protrudes from an annular-shaped portion toward the center of the power substrate 32. The housing connection patterns 196 and 296 are electrically connected to the heat sink 63 by the bolts 329, as shown in FIG. 10. That is, the housing connection patterns 196 and 296 have the same potential as the housing 830. In addition, slits (not shown) are formed over the entire periphery at the outer edge of the housing connection patterns 196 and 296. As such, the patterns 196 and 296 are not connected to other wiring patterns on the substrate 32 and are in a "floating" state having, for example, a floating ground or a floating voltage.

The first electro-mechanical connection capacitor 144 is mounted on the power substrate 32, and connects the ground pattern of the first system L1 and the housing connection pattern 196. The second electro-mechanical connection capacitor 244 is mounted on the power substrate 32, and connects the ground pattern of the second system L2 and the housing connection pattern 296.

The noise generated in the first inverter 120 propagates to the housing 830 via the motor terminals 163 and 263, the lead wires 185 and 285, and the motor winding 180. Here, the noise propagated to the second system L2 through the housing 830 and the like returns to the first system L1, that is, the noise source, on the substrates 31 and 32, via the electro-mechanical connection members, or, by way of the bolts 319 and 329, the electro-mechanical connection capacitors 243 and 244, the wiring pattern of the substrates 31 and 32, and the inter-system ground connection capacitors 411 and 412. In such manner, the noise propagated to the other system through the motor 80 returns to the noise source of the subject system via the inter-system ground connection capacitors 411 and 412.

In the present embodiment, the plurality of inverters 120 and 220 are provided as the power modules 160 and 260 modularized for each system, and the power modules 160 and 260 are configured to dissipate heat to the heat sink 63 having the same potential as the housing 830. The control substrate 31 and the power substrate 32 are provided on both sides of the power modules 160 and 260 and the heat sink 63. That is, the control substrate 31 may be disposed on one side of the heat sink 63 and the power substrate 32 may be disposed on a side of the heat sink 63 that is opposite the side on which the control substrate 31 is disposed. The electro-mechanical connection capacitors 143, 144, 243, and 244 electrically connect the housing connection patterns 194, 196, 294, and 296 and the heat sink 63.

The heat sink 63 is connected to the housing 830 and has the same electrical potential as the housing 830. Based on the connection of the heat sink 63 to the housing 830, electrically connecting the housing connection patterns 194, 196, 294, and 296 to the heat sink 63 provides a return path to return noise propagated from the motor 80 back to the ECU 10. In particular, since the substrates 31 and 32 and the heat sink 63 are in surface contact with each other at the housing connection patterns 194, 196, 294, and 296 in the present embodiment, noise can be returned to the ECU 10 via a low impedance pathway. As such, the drive device 1 of the present embodiment can achieve the same advantageous effects as those achieved by the drive device in the previous embodiment.

The idea of "a drive circuit mounted on a substrate" includes not only the configuration of the first embodiment where the switching elements 121-126 and 221-226 that respectively make up the inverters 120 and 220 are surface mounted to the substrate 30, but also includes the configuration of the present embodiment, where the vertically arranged power modules 160 and 260 are connected to the substrates 31 and 32.

Other Embodiments

In the above-described embodiments, the inter-system ground connection capacitor and the electro-mechanical connection capacitor are mounted to the substrate. In other embodiments, one of the inter-system ground connection capacitor and the electro-mechanical connection capacitor may be omitted. The quantity and mounting positions of the inter-system ground connection capacitors and the electro-mechanical connection capacitors may be different from those in the above-described embodiments, that is, the quantity and mounting positions may be arbitrarily set based on the noise performance, the arrangement of the other electronic components on the substrate, and like design factors. For example, in the first embodiment, the inter-system ground connection capacitor and the electro-mechanical connection capacitor are mounted on a cover side surface of the substrate. However, at least one of those capacitors may be mounted on a motor side surface or they may be mounted on both sides of the substrate.

In the above-described embodiments the substrate is provided with the slit for separating the two systems. In other embodiments, the slit may be omitted from the substrate.

In the above-described embodiments, the power supply connector and the control connector are integrated to have one body. However, the power supply connector and the control connector may have separate bodies.

In the above-described embodiments, the power supply and the ground are separately provided for each system. In other embodiments, the power supply and the ground may be shared by multiple systems.

Similarly, components such as the controller/microcomputer and integrated circuit IC may be shared by multiple systems.

In the above-described embodiments, the drive device includes two winding sets and two drive circuits to have a two system configuration (i.e., redundant configuration). In other embodiments, the number of systems may be three or more. In the above-described embodiments, the inverter is described as corresponding to the drive circuit. In other embodiments, if the noise generation source is the controller/microcomputer or the integrated circuit (IC), the controller/microcomputer or the IC may be considered as a "drive circuit."

In the above-described embodiments, the motor is a three-phase brushless motor. In other embodiments, the motor/motor unit is not necessarily limited to a three-phase brushless motor and may be any type of motor/motor unit. The motor unit is not necessarily limited to an electric motor, but may also be a generator, or motor-generator that functions as both an electric motor and a generator.

In the above-described embodiments, the drive device is applied to an electric power steering device (i.e., used in an electric power steering device). In other embodiments, the drive device may also be applied to devices other than the electric power steering device. As described above, the present disclosure is not limited to the above-described embodiments, and may be further implemented in various forms without departing from the spirit and scope of the present disclosure.

What is claimed is:

1. A drive device comprising:
   a motor having a first winding set and a second winding set housed together in one housing;
   a first system including a first drive circuit connected to a first power supply and a first ground, the first system configured to control a power supply from the first power supply to the first winding set;
   a second system including a second drive circuit connected to a second power supply and a second ground, the second system configured to control a power supply from the second power supply to the second winding set;
   a substrate having the first drive circuit and the second drive circuit mounted thereon; and
   an inter-system ground connection capacitor mounted on the substrate and configured to electrically connect the first ground of the first system with the second ground of the second system.

2. The drive device of claim 1, wherein
   the substrate has a slit formed thereon for separating wiring patterns on the substrate into the first system and the second system, and wherein
   the inter-system ground connection capacitor is mounted at a position on the substrate to bridge the slit.

3. The drive device of claim 1, wherein
   the inter-system ground connection capacitor is disposed at a bridging position on the substrate, wherein the inter-system ground connection capacitor is configured to connect
   a first substrate connection portion in the first system to a position or a corresponding position on the substrate where the second drive circuit is disposed, and
   a second substrate connection portion in the second system to a position or a corresponding position on the substrate where the first drive circuit is disposed.

4. The drive device of claim 1 further comprising:
   a first electro-mechanical connection capacitor mounted on the substrate and configured to connect the first ground of the first system and the second ground of the second system to a first housing connection pattern; and
   a second electro-mechanical connection capacitor mounted on the substrate and configured to connect the first ground of the first system and the second ground of the second system to a second housing connection pattern, wherein
   the first housing connection pattern is isolated from the second housing connection pattern and electrically connected to the housing, and wherein
   the second housing connection pattern is isolated from the first housing connection pattern and electrically connected to the housing.

5. The drive device of claim 4, wherein
   the first drive circuit is included in a first power module configure to dissipate heat to a heat sink, and wherein
   the second drive circuit is included in a second power module configured to dissipate heat to the heat sink, and wherein
   the substrate is disposed on one side of the heat sink, and wherein another substrate is disposed on another side of the heat sink, the other side of the heat sink opposite the one side of the heat sink on which the substrate is disposed, and wherein the first and second electro-mechanical connection capacitors are configured to electrically connect the first and second housing connection patterns and the heat sink, and wherein the heat sink has the same electrical potential at the housing.

6. The drive device of claim 1, wherein
the substrate is fixed to one axial end of the housing.

7. A drive device comprising:
a motor having a first winding set and a second winding set housed together in one housing;
a first system including a first drive circuit connected to a first power supply and a first ground, the first system configured to control a power supply from the first power supply to the first winding set;
a second system including a second drive circuit connected to a second power supply and a second ground, the second system configured to control a power supply from the second power supply to the second winding set;
a substrate having the first drive circuit and the second drive circuit mounted thereon;
a first electro-mechanical connection capacitor mounted on the substrate and configured to connect the first ground to the housing;
a second electro-mechanical connection capacitor mounted on the substrate and configured to connect the second ground to the housing;
a first housing connection pattern disposed on the substrate and electrically connected to the housing; and
a second housing connection pattern disposed on the substrate and electrically connected to the housing, wherein
the first housing connection pattern is isolated from the second housing connection pattern on the substrate, and the second housing connection pattern is isolated from the first housing connection pattern on the substrate, and wherein
the first electro-mechanical connection capacitor is further configured to connect the first housing connection pattern to the first ground, and wherein
the second electro-mechanical connection capacitor is further configured to connect the second housing connection pattern to the second ground.

8. The drive device of claim 7 further comprising:
an inter-system ground connection capacitor mounted on the substrate and configured to provide an electrical connection between the first ground of the first system and the second ground of the second system.

9. The drive device of claim 7, wherein
the first drive circuit is included in a first power module configure to dissipate heat to a heat sink, and wherein
the second drive circuit is included in a second power module configured to dissipate heat to the heat sink, and wherein
the substrate is disposed on one side of the heat sink, and wherein
another substrate is disposed on another side of the heat sink, the other side of the heat sink opposite the one side of the heat sink on which the substrate is disposed, and wherein
the first and second electro-mechanical connection capacitors are configured to electrically connect the first and second housing connection patterns and the heat sink, and wherein
the heat sink has the same electrical potential at the housing.

10. The drive device of claim 7, wherein
the substrate is fixed to one axial end of the housing.

11. An electric power steering device comprising:
a drive device including:
  a motor having a first winding set and a second winding set housed together in one housing;
  a first system including a first drive circuit connected to a first power supply and a first ground, the first system configured to control a power supply from the first power supply to the first winding set;
  a second system including a second drive circuit connected to a second power supply and a second ground, the second system configured to control a power supply from the second power supply to the second winding set;
  a substrate having the first drive circuit and the second drive circuit mounted thereon; and
  an inter-system ground connection capacitor mounted on the substrate and configured to electrically connect the first ground of the first system with the second ground of the second system; and
a power transmission member configured to transmit power of the motor, wherein
the motor is configured to output a torque for steering a vehicle.

* * * * *